United States Patent
McGrath et al.

(10) Patent No.: US 6,294,220 B1
(45) Date of Patent: Sep. 25, 2001

(54) POST-TREATMENT FOR COPPER ON PRINTED CIRCUIT BOARDS

(75) Inventors: Peter T. McGrath, Mission Viejo; Abayomi Owei, Rancho Cucamonga, both of CA (US); Saeed Sardar, Lake Mary, FL (US); Eric Yakobson, San Juan Capistrano, CA (US)

(73) Assignee: Alpha Metals, Inc., Jersey City, NJ (US)

( * ) Notice: Subject to any disclaimer, the term of this patent is extended or adjusted under 35 U.S.C. 154(b) by 0 days.

(21) Appl. No.: 09/345,675

(22) Filed: Jun. 30, 1999

(51) Int. Cl.⁷ .............................. B05D 3/04; C25D 5/48; C35C 22/82
(52) U.S. Cl. .................... 427/337; 427/96; 427/123; 205/220; 205/296; 148/272
(58) Field of Search ..................................... 205/291, 296, 205/220; 427/96, 98, 123, 337, 305, 437, 443.1; 148/272

(56) References Cited

U.S. PATENT DOCUMENTS

| | | |
|---|---|---|
| 4,358,479 | 11/1982 | Canestaro et al. . |
| 4,409,037 | 10/1983 | Landau . |
| 4,512,818 | 4/1985 | Valayil et al. . |
| 4,642,161 * | 2/1987 | Akahoshi et al. .................. 156/630 |
| 4,717,439 | 1/1988 | Hadju et al. . |
| 4,775,444 | 10/1988 | Cordani . |
| 4,844,981 | 7/1989 | Landau . |
| 4,902,551 | 2/1990 | Nakaso et al. . |
| 4,969,958 | 11/1990 | Mombrun et al. . |
| 5,006,200 | 4/1991 | Chen . |
| 5,076,864 | 12/1991 | Tanaka et al. . |
| 5,106,454 | 4/1992 | Allardyce et al. . |
| 5,147,492 | 9/1992 | Chen . |
| 5,261,154 | 11/1993 | Ferrier et al. . |
| 5,289,630 | 3/1994 | Ferrier et al. . |
| 5,382,333 | 1/1995 | Ando et al. . |
| 5,492,595 | 2/1996 | Carano et al. . |
| 5,501,350 | 3/1996 | Yoshida et al. . |
| 5,556,532 | 9/1996 | Markowski . |
| 5,721,014 | 2/1998 | Fakler et al. . |
| 5,800,859 * | 9/1998 | Price et al. .............................. 427/98 |

FOREIGN PATENT DOCUMENTS

| | | |
|---|---|---|
| 0 189 913 | 8/1988 | (EP) . |
| WO 96 19097 | 6/1996 | (WO) . |

* cited by examiner

*Primary Examiner*—Brian K. Talbot
(74) *Attorney, Agent, or Firm*—Mintz, Levin, Cohn, Ferris, Glovsky and Popeo, P.C.

(57) ABSTRACT

A post-treatment method for copper on printed circuit boards is disclosed. The method comprises forming a cupric-based organometallic conversion coating on a copper surface of a printed circuit board, and then converting the cupric-based organometallic conversion coating to a cuprous-based organometallic conversion coating. The resulting cuprous-based organometallic conversion coating is desirable in that it improves copper to dielectric bond integrity.

14 Claims, No Drawings

POST-TREATMENT FOR COPPER ON PRINTED CIRCUIT BOARDS

FIELD OF THE INVENTION

The present invention relates to a treatment solution and method for copper surfaces on printed circuit boards. More particularly, the present invention relates to a solution and method for improving copper-to-dielectric bond integrity by increasing the chemical resistance of organometallic conversion coatings that are formed on the surface of copper pads and traces on printed circuit boards.

BACKGROUND OF THE INVENTION

Multilayer circuit boards (MLBs) typically consist of alternating layers of copper and dielectric material, which are laminated together. There are a variety of MLBs on the market today. Depending on the materials they are made of, they can be rigid (if formed from rigid materials such as glass-reinforced epoxy-resin, BT, CE, PTFE, etc.), flexible (if formed from flexible materials such as polyester or polyimide) or they can be a combination, (i.e., so-called "rigid-flex"). If the alternating layers of copper and dielectric are applied one onto another in a sequential process rather than laminated simultaneously into a single package, they are classified as Sequential Build-Up (SBU) Boards. The integrity of MLB depends upon a reliable bond being formed between the copper and dielectric. In conventional MLB manufacturing processes, copper layers are treated using a hydroxide/chlorite based treatment solution. This so-called "Black Oxide Process" provides an enhanced copper-to-dielectric bond. Examples and details of the Black Oxide Process are set forth in, for example, U.S. Pat. Nos. 4,358,479; 4,409,037; 4,512,818; 4,844,981 and 4,969,958. However, the Black Oxide Process suffers from various limitations including the following:

1. The process can be carried out only in an aggressive strongly alkaline solution at about 160–170° F.

2. The processing time is long, thereby creating bottlenecks in the manufacturing sequence.

3. The Black Oxide coating readily dissolves in acids, which makes it susceptible to acid attack in subsequent processing steps. This frequently results in an undesirable phenomenon commonly referred to as "pink ring" and sometimes can even result in "wedge voids" and ultimately delamination between the copper and adjacent dielectric layer.

4. The initially high bond strength between the Black Oxide coated copper and the dielectric material usually deteriorates rapidly as the MLB passes through subsequent thermal excursions during the fabrication and assembly processes.

A reliable copper-to-dielectric bond is especially important for flex and SBU circuit boards. Polyimides, which are used for flexible boards, and photo-imageable dielectrics used for SBU circuit boards, are known to exhibit lower copper-to-dielectric bond strength than conventional epoxy-glass based rigid circuit boards.

The Black Oxide coating comprises a mixture of cupric and cuprous oxides. This coating exhibits poor chemical resistance on the basis that it is predominantly formed of cupric oxide. Unlike cupric oxide (black) which is easily attacked by acids, cuprous oxide (red to brown) is relatively chemically inert.

In an attempt to eliminate "pink ring" and to prevent deterioration of the bond strength, two types of post-treatments for the Black Oxide Process have been developed. The first type is based on a reduction process as disclosed in, for example, U.S. Pat. Nos. 4,642,161; 4,902,551; 5,006,200; 5,076,864; 5,147,492; 5,382,333; 5,492,595; 5,556,532 and 5,721,014. The second Black Oxide post-treatment type is based on partial dissolution of the oxide coating as described in, for example, U.S. Pat. Nos. 4,717,439; 4,775,444; 5,106,454; 5,261,154; 5,289,630 and 5,501,350. Both of these techniques achieve similar results, although they do so through different chemical mechanisms. The first mechanism is a reduction process, which partially converts the cupric oxide into a mixture of cuprous oxide and metallic copper. The second mechanism is a dissolution process, which selectively dissolves cupric oxide, thereby leaving cuprous oxide on the surface. Both processes convert Black Oxide (predominantly cupric) into a surface rich in cuprous oxide. Unfortunately, however, although Black Oxide reduction and dissolution post-treatments do eliminate "pink ring" and improve the acid resistance of the coating to some extent, they do not solve all of the above mentioned problems associated with the Black Oxide performance.

Furthermore, reduced Black Oxide has been found to suffer from a rapid re-oxidation of the surface during baking steps, which are used in MLB manufacturing processes in order to remove absorbed moisture from the dielectric prior to the lamination steps. The re-oxidation of the surface manifests itself by a noticeable darkening of the coating after the baking step. The darker color of the coating indicates the reappearance of cupric oxide, which once again makes the coating more susceptible to chemical attack in subsequent processing steps.

Partially dissolved Black Oxide is susceptible to the formation of a powdery, poorly adherent layer of cuprous oxide which forms on the surface due to undercutting action of the chemical bath used for the dissolution. This powdery portion of the coating prevents the formation of a strong copper-to-dielectric bond. In addition, it makes it impossible to use this process in a horizontal conveyorized mode due to the formation of roller marks, which can occur in the powdery surface.

Recently a new alternative to the Black Oxide Process described above has been introduced. Instead of forming cupric oxide, it produces an organometallic conversion coating (OMCC) on the copper surface. In general, the purpose of organometallic conversion coatings is to form a barrier layer on the underlying metal surface, thereby protecting it from oxidation and corrosion, and/or increasing its bond to the dielectric material. OMCCs are the product of a chemical reaction between metal ions (in single or multiple valency states) and organic compounds. As such, they are readily distinguished from inorganic Black Oxide. The OMCC comprises a film of metal ions tied into a complex or otherwise bonded with one or more organic materials. Such processes for fortning an OMCC are disclosed in U.S. Pat. Nos. 5,800,859 and 5,869,130.

The organometallic conversion coating that forms during this process is much more acid resistant than Black Oxide coatings. It is not, however, completely impervious to chemical attack since it still contains a portion of a cupric-based organometallic compound in its composition.

The mechanism of the "wedge void" formation discussed below will illustrate the significance of the inventive post-treatment step.

After lamination the MLB panels are drilled. During the drilling operation, vibration of the drill bit can create microfractures in the copper/dielectric interface. Solvent conditioners then can get absorbed into the microgaps between the copper and the dielectric. Subsequent treatment with permanganate solution will oxidize, i.e. remove, this already swelled resin creating a "wedge". Microetch solution will attack the copper and widen the gap. Pre-dip and activator solutions typically are fairly concentrated hydrochloric acid based solutions, which will further remove the copper treatment layer. If electroless copper fails to completely seal the "wedge", the chemical attack will continue when the article is immersed in acid cleaner, microetch solution, acid dip and acid copper. When the "wedge" is relatively small, acid copper will completely fill the gap resulting in typical "pink ring" appearance. If the gap is large enough, it may bridge only partially or may not bridge at all leading to a "wedge void" defect. In the most severe cases, the result is delamination.

The above notwithstanding, a need still exists for an improved method of enhancing the copper to dielectric bond in MLBs, while at the same time providing enhanced chemical resistance to the resulting article.

SUMMARY OF THE INVENTION

The present invention relates to a treatment solution and process that overcomes the problems associated with known methods for enhancing the copper to dielectric bond during MLB manufacture. More particularly, the present invention relates to a method for enhancing the bond integrity by increasing chemical resistance of the adhesion promoting copper coating by converting cupric-based organometallic compounds on the copper surface into cuprous-based organometallic conversion coatings. This is achieved by reduction and/or by partial dissolution of the organometallic coating, and optionally applying a copper oxidation inhibitor at the same time.

DETAILED DESCRIPTION OF THE INVENTION

The basis of the present invention is to significantly improve chemical resistance of an organometallic conversion coating (OMCC) making it resistant to chemical attack during the desmear, electroless copper and acid copper electroplating processes, thereby eliminating "pink ring", "wedge voids" and a propensity towards delamination due to chemical attack and enhancing the bond integrity. Improved chemical resistance can be accomplished by converting most of the cupric-based organometallic compound on the surface into a cuprous-based organometallic conversion coating. This conversion can be achieved by reduction and/or by dissolution. Post-treated OMCC can be easily differentiated from either reduced or partially dissolved Black Oxide. The latter is claimed to consist primarily of metallic copper. Reduced OMCC remains an organometallic complex in which most of the divalent copper is reduced to monovalent. Similarly, partially dissolved Black Oxide is still a mixture of cuprous and cupric oxides, while partially dissolved OMCC is an organometallic complex based primarily on monovalent copper. Optionally, the composition can contain a copper oxidation inhibitor or a combination of several inhibitors in order to prevent re-oxidation of the OMCC in subsequent processing steps. The resulting cuprous-based OMCC is substantially more resilient and resistant to subsequent MLB processing steps, than either post-treated Black Oxide or untreated OMCC.

A great variety of materials can be used for reduction or dissolution of OMCC. One of the most effective reducers is DMAB (dimethylaminoborane), although other aminoboranes (e.g. diethylaminoborane, morpholine borane, etc.) can be used as well. Other reducers that can be utilized for this application are: ammonium, alkali and/or alkaline earth metal borohydrides, hypophosphites, sulfites, bisulfites, hydrosulfites, metabisulfites, dithionates, tetrathionates, thiosulfates, thioureas, hydrazines, hydroxylamines, aldehydes (including formaldehyde and glyoxal), glyoxylic acid and reducing sugars. Electric current can be used for the reduction as well.

If dissolution agents are to be used, any of the known cupric ion chelators (complexors), organic or inorganic acids and/or their salts, (or a combination of them), can be utilized for this application. These include EDTA, HEEDTA, NTA, DTPA, DCTA, Quadrol, organic phosphonates (Dequests), organic acids (citric, tartaric, gluconic, glutamic, sulfamic, glycolic, glycine, malic, maleic, salicylic, ascorbic, formic, etc.), inorganic acids (hydrochloric, hydrofluoric, hydrobromic, nitric, chromic acids, etc.), and/or their ammonium, alkali, alkaline earth metal and/or amine salts, amines (MEA, DEA, TEA, TMAH, EDA, DETA, TETA, TEPA, etc.), ammonium hydroxide, pyrophosphates, etc. Quadrol, EDTA and phosphonates are preferred. Additionally, it may be advantageous to use the dissolution agents with one or more reducing agents.

As noted above, copper oxidation inhibitors may optionally be used as well. Thus, for example, one or more of the following copper oxidation inhibitors can be incorporated into the composition: unsubstituted and/or alkyl-, aryl-, alkylaryl-substituted azole derivatives, (including halogen substituted derivatives thereof), e.g. benzotriazol (BTA), tolyltriazol (TTA), 5-methylbenzimidazole, 2-bromobenzyl benzimidazole, 2-chlorobenzyl benzymidazole, 2-bromophenyl benzimidazole, 2-chlorophenyl benzimidazole, 2-bromoethylphenyl benzimidazole, 2-chloroethylphenyl benzimidazole and 2-undecyl-4-methylimidazole. benzotriazol and tolyltriazol are preferred. Cationic, amphoteric, anionic and/or non-ionic surfactants can also be utilized to enhance the effectiveness of the post-treatment solution.

A combination of a reducer (or any number of reducers) with a dissolution agent (or any number of dissolution agents) can be used as well. The pH, temperature, concentration and processing time should be adjusted appropriately to insure effective reduction and/or dissolution of the cupric ion. Optionally, this solution may contain an oxidation inhibitor or a combination of several inhibitors.

It should be understood, as well, that the materials described above, while useful as a post-treatment following formation of the organometallic conversion coating, need not be limited to post-treatment applications. Rather, treatment may be accomplished by incorporating such materials directly into the solution used to form the original organometallic conversion coating.

EXAMPLES

Example 1

A piece of 1 oz. DSTFoil (available from Polyclad Laminates) and an epoxy-glass laminate panel clad with the same DSTFoil on both sides (Polyclad Laminates) were processed through the sequence of the following steps:

| | |
|---|---|
| 1. PC 7036 Microetch (available from Alpha PC Fab) | 90° F., 1 min. |
| 2. Rinse | ambient, 1 min. |
| 3. PC 7086 Alkaline Cleaner (Alpha PC Fab) | 130° F., 1 min. |
| 4. DI Rinse | ambient, 1 min. |
| 5. Pre-Dip (5% PC-7023) | 105° F., 30 sec. |
| 6. PC 7023 Adhesion Promoter (Alpha PC Fab) | 105° F., 1 min. |
| 7. DI Rinse | ambient, 1 min. |
| 8. Hot Air Dry | 160° F., 1 min. |

Subsequently, the foil was laid-up with two layers of Polyclad 1080 B-stage pre-preg (available from Polyclad Laminates) and two layers of Polyclad 7628 pre-preg on one side, treatment layer facing the 1080 pre-preg. The DSTFoil clad copper/epoxy-glass laminate was laid-up with two layers of Polyclad 2313 on each side. Both lay-ups were then pressed at 370° F. temperature and 350 psi pressure for 60 minutes.

The laminated foil panel was masked with ⅛ inch wide tape and the exposed copper was etched off in 500 g/L ferric chloride solution at 130° F. The panel was rinsed, dried and the masking tape was removed. The adhesion of the copper foil to the cured epoxy resin was then tested by peeling back the ⅛ inch wide copper strips using CECO TA 620-30 Peel Tester. The adhesion was found to be 6.76 Lb/in.

The laminated copper clad panel was cut into 2 inch wide strips, which were subsequently immersed into PC 7457 HASL flux (available from Alpha PC Fab) and then into the molten solder at 500° F. Every minute a strip was taken out of the solder and checked for signs of delamination. The time-to-delamination was found to be 9 minutes.

Example 2

Example 1 was repeated with the exception that the DSTFoil and the copper clad laminate after the treatment in PC 7023 Adhesion Promoter were immersed in the solution made up from 6 g/L DMAB and 7.5 g/L KOH at 105° F. for 2 minutes. The adhesion was found to be 7.36 Lb/in and the time-to-delamination was 9 minutes and 30 seconds.

Example 3

A piece of standard 1 oz. foil was taped to a circuit board panel and processed using the same steps as in Example 1 in Coates-ASI horizontal conveyorized wet processing spray machine. The tape was removed and the foil was laminated and tested for adhesion as in Example 1. The adhesion was found to be 4.6 Lb/in.

Example 4

Example 3 was repeated with the exception that after the processing in the horizontal equipment the foil was immersed in 5% (vol.) HCL for 1 min. at ambient temperature. The adhesion was 5.1 Lb/in.

Example 5

Example 4 was repeated with the exception that 38 g/L $Na_2EDTA$ solution was used as the post-treatment at 130° F., pH 4.1 for 6 min. The adhesion was 6.2 Lb/in.

Example 6

Example 4 was repeated with the exception that 76 g/L $Na_27EDTA$ solution was used as the post-treatment at 130° F., pH 4.1 for 1 min. The adhesion was 6.6 Lb/in.

Example 7

Example 4 was repeated with the exception that 10% (vol.) Versene 100 (EDTA solution available from Dow Chemical) solution was used as the post-treatment at 130° F., pH 10 for 1 min. The adhesion was 6.8 Lb/in.

Example 8

Example 4 was repeated with the exception that 10% (vol.) Versene 100 solution was used as the post-treatment at 130° F., pH 13 for 1 min. The adhesion was 6.9 Lb/in.

Example 9

Example 4 was repeated with the exception that 10% (vol.) Quadrol (ethoxylated/propoxylated ethylene diamine derivative available from BASF) solution was used as the post-treatment at 130° F., pH 10 for 1 min. The adhesion was 6.9 Lb/in.

Example 10

Example 4 was repeated with the exception that 10% (vol.) Quadrol solution was used as the post-treatment at 130° F., pH 13 for 1 min. The adhesion was 6.9 Lb/in.

Equivalents

From the foregoing detailed description of the specific embodiments of the invention, it should be apparent that a unique process for converting a cupric-based organometallic conversion coating into a cuprous-based organometallic conversion coating has been described. Although particular embodiments have been disclosed herein in detail, this has been done by way of example for purposes of illustration only, and is not intended to be limiting with respect to the scope of the appended claims which follow. In particular, it is contemplated by the inventor that various substitutions, alterations, and modifications may be made to the invention without departing from the spirit and scope of the invention as defined by the claims.

What is claimed is:

1. A method for treating copper surfaces on printed circuit boards comprising the steps of:
 a) providing a printed circuit board having a copper surface thereon;
 b) forming a cupric-based organometallic conversion coating on at least a portion of the copper surface; and
 c) contacting the cupric-based organometallic conversion coating with a treatment solution, the treatment solution causing a reduction reaction, a dissolution reaction or both at the cupric-based organometallic conversion coating, substantially converting the cupric-based organometallic conversion coating into a cuprous-based organometallic conversion coating.

2. The method of claim 1, which further includes the step of applying a copper oxidation inhibitor to the cupric-based organometallic conversion coating.

3. The method of claim 2, wherein the copper oxidation inhibitor is applied simultaneously with the treatment solution.

4. The method of claim 3, wherein the copper oxidation inhibitor is incorporated into the treatment solution.

5. The method of claim 1, wherein the treatment solution causes a reduction reaction, such reduction reaction resulting from contacting the cupric-based organometallic conversion coating with an aminoborane.

6. The method of claim 5, wherein the aminoborane is selected from the group consisting of dimethylaminoborane, diethylaminoborane, and morpholine borane.

7. The method of claim 1, wherein the treatment solution causes a reduction reaction, such reduction reaction resulting from contacting the cupric-based organometallic conversion coating with a reducing agent selected from the group consisting of ammonium, alkali and/or alkaline earth metal borohydrides, hypophosphites, sulfites, bisulfites, hydrosulfites, metabisulfites, dithionates, tetrathionates, thiosulfates, thioureas, hydrazines, hydroxylamines, aldehydes, glyoxylic acid and reducing sugars.

8. The method of claim 1, wherein the treatment solution is incorporated into a solution used to form the cupric-based organometallic conversion coating.

9. The method of claim 2, wherein the copper oxidation inhibitor is selected from the group consisting of unsubstituted azole derivatives, alkyl-substituted azole derivatives, aryl-substituted azole derivatives, alkylaryl-substituted azole derivatives, and combinations and halogen substituted derivatives thereof.

10. The method of claim 9, wherein the copper oxidation inhibitor is selected from the group consisting of BTA, TTA, 5-methylbenzimidazole, 2-bromobenzyl benzimidazole, 2-chlorobenzyl benzymidazole, 2-bromophenyl benzimidazole, 2-chlorophenyl benzimidazole, 2-bromoethylphenyl benzimidazole, 2-chloroethylphenyl benzimidazole and 2-undecyl-4-methylimidazole and combinations thereof.

11. The method of claim 2 wherein the treatment solution further comprises a surfactant.

12. The method of claim 11 wherein the surfactant is selected from the group consisting of ionic surfactants.

13. The method of claim 11 wherein the surfactant is selected from the group consisting of non-ionic surfactants.

14. A method for treating copper surfaces on printed circuit boards comprising the steps of:

a) providing a printed circuit board having a copper surface thereon;

b) forming a cupric-based organometallic conversion coating on at least a portion of the copper surface; and c) contacting the cupric-based organometallic conversion coating with a treatment solution, the treatment solution comprising an inhibitor of copper oxidation and a dimethylaminoborane, and being applied under conditions sufficient to substantially convert the cupric-based organometallic conversion coating into a cuprous-based organometallic conversion coating.

* * * * *